US012811347B2

(12) United States Patent
Morgan et al.

(10) Patent No.: US 12,811,347 B2
(45) Date of Patent: Nov. 24, 2026

(54) GROUND BUS FOR A CABLE CARD ASSEMBLY OF AN ELECTRICAL CONNECTOR

(71) Applicant: TE Connectivity Solutions GmbH, Schaffhausen (CH)

(72) Inventors: Chad William Morgan, Carneys Point, NJ (US); John Joseph Consoli, Harrisburg, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 303 days.

(21) Appl. No.: 18/453,553

(22) Filed: Aug. 22, 2023

(65) Prior Publication Data

US 2025/0070519 A1 Feb. 27, 2025

(51) Int. Cl.

*H01R 13/6592* (2011.01)
*H01R 12/53* (2011.01)
*H05K 1/02* (2006.01)

(52) U.S. Cl.

CPC ......... *H01R 13/6592* (2013.01); *H01R 12/53* (2013.01); *H05K 1/0219* (2013.01); *H05K 2201/10356* (2013.01)

(58) Field of Classification Search

CPC ... H01R 13/6592; H01R 12/53; H05K 1/0219
USPC .......................... 439/607.46, 607.41, 607.44
See application file for complete search history.

(56) References Cited

U.S. PATENT DOCUMENTS

| | | | | |
|---|---|---|---|---|
| 8,840,432 B2 * | 9/2014 | Alden, III | H05K 1/0216 | 439/607.46 |
| 10,680,364 B2 * | 6/2020 | Champion | H01R 13/6582 | |
| 11,785,731 B1 * | 10/2023 | Morgan | H05K 5/0026 | 174/545 |
| 11,862,902 B2 | 1/2024 | Cheng | | |
| 12,230,926 B2 * | 2/2025 | Zi | H01R 13/6594 | |
| 12,388,205 B2 * | 8/2025 | Morgan | H01R 13/6592 | |
| 2014/0349496 A1 * | 11/2014 | Zhu | H05K 1/0219 | 439/108 |
| 2021/0029835 A1 | 1/2021 | Casey | | |
| 2021/0044040 A1 * | 2/2021 | Zheng | H01R 25/00 | |
| 2022/0329032 A1 * | 10/2022 | Little | H01R 12/75 | |
| 2023/0077720 A1 * | 3/2023 | Rossman | H01R 13/6585 | 439/607.46 |
| 2023/0299544 A1 * | 9/2023 | Champion | H01R 12/707 | 439/55 |
| 2023/0369784 A1 | 11/2023 | Hamner et al. | | |
| 2025/0023268 A1 * | 1/2025 | Hornung | H01R 12/716 | |

* cited by examiner

*Primary Examiner* — Hae Moon Hyeon

(57) ABSTRACT

A cable card assembly includes a circuit card having an array of signal pads on a surface of the circuit card. Cables including signal conductors and cable shields are electrically connected to the circuit card. The cable card assembly includes a ground bus coupled to the circuit card electrically connected to the cable shields and a ground plane of the circuit card. The ground bus includes a shell to form pockets, arranged in multiple rows, which receive the corresponding cables. The shell includes solder standoff posts extending from an inner end of the shell that are terminated to the circuit card. The solder standoff post holds the inner end elevated from the surface of the circuit card.

20 Claims, 9 Drawing Sheets

GROUND BUS FOR A CABLE CARD ASSEMBLY OF AN ELECTRICAL CONNECTOR

BACKGROUND OF THE INVENTION

The subject matter herein relates generally to electrical connectors.

Electrical connectors are typically used to electrically couple various types of electrical devices to transmit signals between the devices. At least some known cable assemblies have cables between electrical connectors, which are coupled to corresponding electrical devices. The cables each have a signal conductor, or a differential pair of signal conductors surrounded by a shield layer that, in turn, is surrounded by a cable jacket. The shield layer includes a conductive foil, which functions to shield the signal conductor(s) from electromagnetic interference (EMI) and generally improve performance. A drain wire may be provided within the cable, electrically connected to the conductive foil. At an end of the communication cable, the cable jacket, the shield layer, and insulation that covers the signal conductor(s) may be removed (e.g., stripped) to expose the signal conductor(s) and the drain wire. The exposed portions of the signal conductor(s) are then mechanically and electrically coupled (e.g., soldered) to corresponding conductors, such as signal pads of a circuit card. The exposed portions are bent and manipulated between the insulator and the signal pads on the circuit card.

However, signal integrity and electrical performance of the electrical connectors are negatively impacted at the interface between the cables and the circuit card. For example, as the signal conductors transition to the circuit card, the cable shield no longer shields the exposed portions of the signal conductors, which affects signal integrity and detrimentally affects performance. Shields may be provided to cover the ends of the cables. However, shielding effectiveness may be poor based on the shape of the shield and gaps or openings in the shield. Assembly of multiple shields to the circuit card may be time consuming and add to the overall assembly cost.

Accordingly, there is a need for an electrical connector having an improved shielded interface with a circuit card that may be manufactured in a cost effective and reliable manner.

BRIEF DESCRIPTION OF THE INVENTION

In one embodiment, a cable card assembly for an electrical connector is provided and includes a circuit card that has an array of signal pads on a surface of the circuit card. The circuit card has a ground plane. The cable card assembly includes cables terminated to the circuit card. The cables include signal conductors and cable shields surrounding the corresponding signal conductors to provide electrical shielding for the signal conductors. The signal conductors are electrically connected to corresponding signal pads of the circuit card. The cable card assembly includes a ground bus coupled to the circuit card. The ground bus is electrically connected to the cable shields of the cables. The ground bus is electrically connected to the ground plane of the circuit card. The ground bus includes a shell to form pockets that receive the corresponding cables. The shell is mounted to the circuit card. The shell includes solder standoff posts extending from an inner end of the shell. The solder standoff post holds the inner end elevated from the surface of the circuit card. The solder standoff posts are terminated to the circuit card.

In another embodiment, a cable card assembly for an electrical connector is provided and includes a circuit card that has an array of signal pads on a surface of the circuit card. The signal pads are arranged in pairs. The array of signal pads are arranged in multiple rows. The circuit card has a ground plane. The cable card assembly includes cables having ends terminated to the circuit card. The cables are arranged in rows. Each cable includes a pair of signal conductors and a cable shield surrounding the corresponding signal conductors to provide electrical shielding for the signal conductors. The signal conductors are electrically connected to corresponding signal pads of the circuit card. The cable card assembly includes a ground bus coupled to the circuit card. The ground bus extends between a front and a rear. The ground bus is electrically connected to the cable shields of the cables. The ground bus is electrically connected to the ground plane of the circuit card. The ground bus includes a shell to form pockets that receive the corresponding cables. The pockets are arranged in a plurality of rows between the front and the rear of the ground bus. The shell has an inner bus member and a plurality of outer bus member coupled to the inner bus member. The inner bus member is mounted to the circuit card. Each outer bus member covers the ends of a different row of the cables.

In a further embodiment, a cable card assembly for an electrical connector is provided and includes a circuit card that has an array of signal pads on a surface of the circuit card. The signal pads are arranged in pairs. The array of signal pads are arranged in multiple rows. The circuit card has a ground plane. The cable card assembly includes cables that have ends terminated to the circuit card. The cables are arranged in rows. Each cable includes a pair of signal conductors and a cable shield surrounding the corresponding signal conductors to provide electrical shielding for the signal conductors. The signal conductors are electrically connected to corresponding signal pads of the circuit card. The cable card assembly includes a ground bus coupled to the circuit card. The ground bus extends between a front and a rear. The ground bus is electrically connected to the cable shields of the cables. The ground bus is electrically connected to the ground plane of the circuit card. The ground bus includes a shell forming pockets receiving the corresponding cables. The pockets are arranged in a plurality of rows between the front and the rear of the ground bus. The shell is mounted to the circuit card. The shell covers the ends of the cables. The shell includes solder standoff posts that extend from an inner end of the shell. The solder standoff post holds the inner end elevated from the surface of the circuit card. The solder standoff posts are terminated to the circuit card.

DETAILED DESCRIPTION OF THE INVENTION

Figure 1:
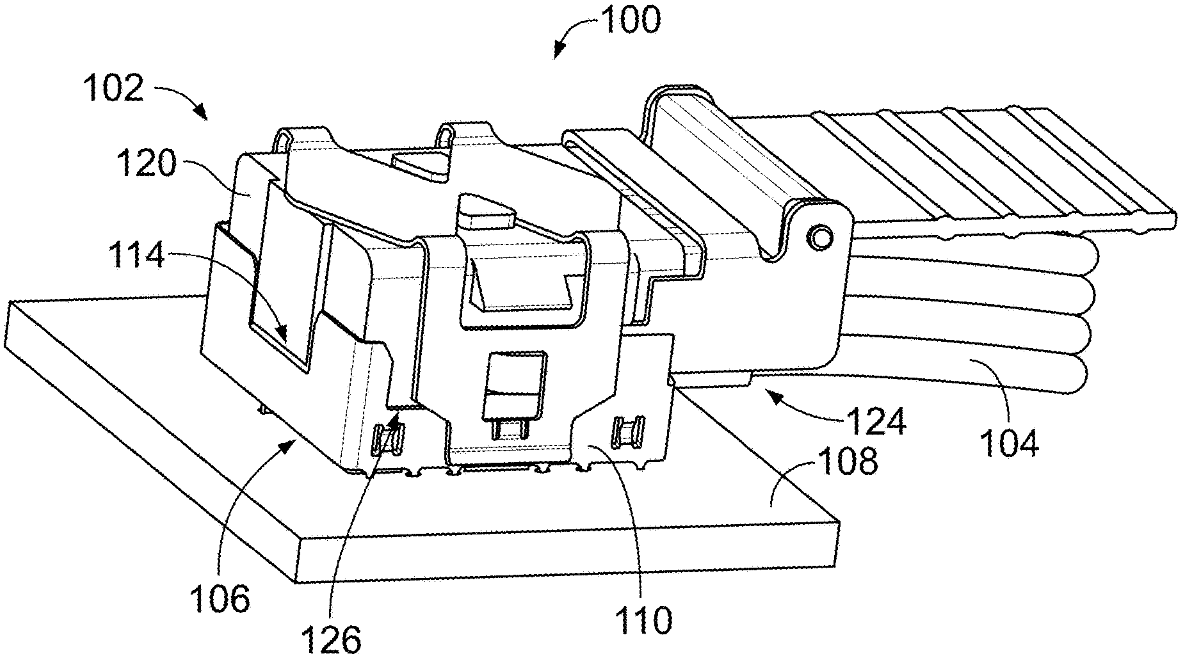
FIG. 1 is a perspective view of a communication system in accordance with an exemplary embodiment.

FIG. 1 is a perspective view of a communication system 100 in accordance with an exemplary embodiment. The communication system 100 includes a first electrical connector 102 provided at ends of cables 104 and a second electrical connector 106. In the illustrated embodiment, the second electrical connector 106 is mounted to a circuit board 108. In other various embodiments, the second electrical connector 106 may be provided at ends of cables (not shown).

In an exemplary embodiment, the second electrical connector 106 is a receptacle connector. The second electrical connector 106 may be a socket connector, such as a header connector. In other embodiments, the second electrical connector 106 may be a card edge connector having a card slot. The first electrical connector 102 is mated to the second electrical connector 106 at a separable interface. In an exemplary embodiment, the first electrical connector 102 is a plug connector configured to be pluggably coupled to the second electrical connector 106. For example, a portion of the first electrical connector 102 may be plugged into a receptacle or opening or slot of the second electrical connector 106. In an exemplary embodiment, the first electrical connector 102 is coupled to the second electrical connector 106 at a separable interface. For example, the first electrical connector 102 is latchably coupled to the second electrical connector 106 using a clip or latching elements. The latch may be releasable to allow removal of the first electrical connector 102 from the second electrical connector 106. The connectors 102, 106 may be input-output (I/O) connectors.

Figure 2:
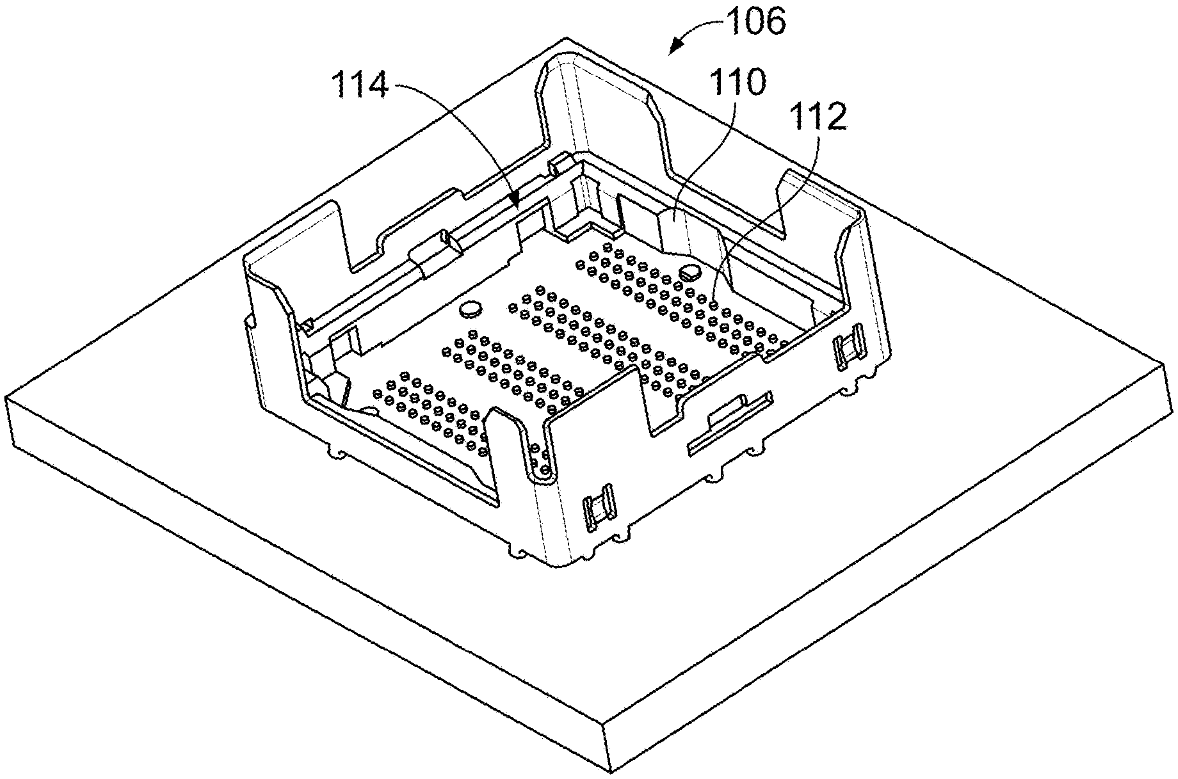
FIG. 2 is a perspective view of the second electrical connector in accordance with an exemplary embodiment.

With additional reference to FIG. 2, which is a perspective view of the second electrical connector 106, the second electrical connector 106 includes a receptacle housing 110 holding an array of contacts 112. In an exemplary embodiment, the receptacle housing 110 includes an opening 114 that receives the first electrical connector 102. The opening 114 may be a socket configured to receive the plug end of the first electrical connector 102. The opening 114 may be a card slot in alternative embodiments. The opening 114 is located at the top of the receptacle housing 110 in the illustrated embodiment. Other locations are possible in alternative embodiments, such as at the front. The contacts 112 have separable mating interfaces. The contacts 112 may define a compressible interface, such as including deflectable spring beams that are compressed when the first electrical connector 102 is received in the opening 114. Optionally, the contacts 112 may be arranged in multiple rows and columns. In various embodiments, the contacts 112 are a land grid array (LGA). In various embodiments, the second electrical connector 106 is a communication device, such as a socket connector. The second electrical connector 106 may be a high-speed connector.

Figure 3:
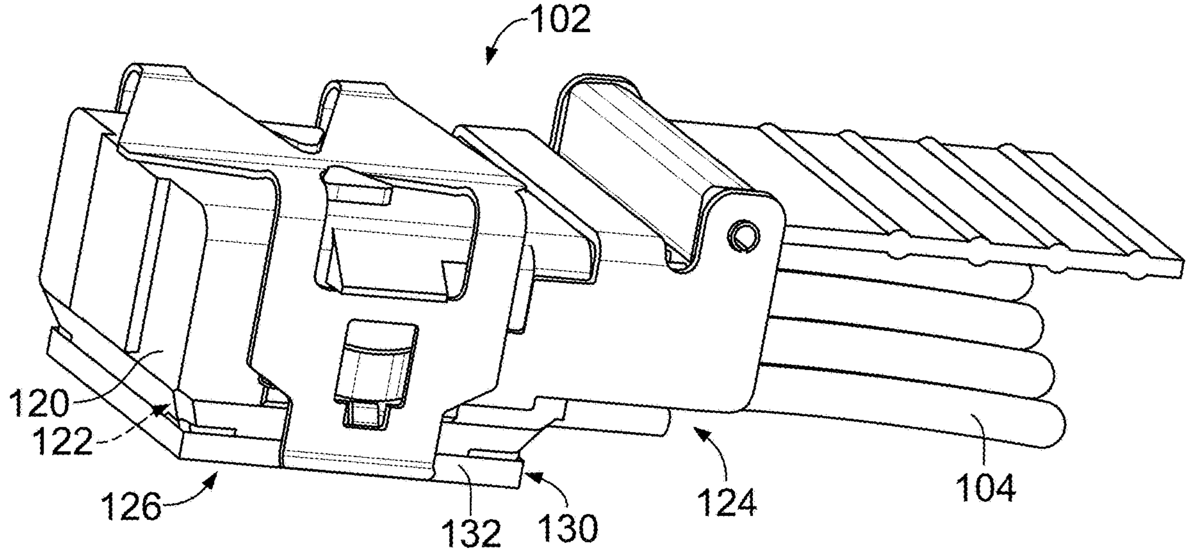
FIG. 3 is a perspective view of the first electrical connector in accordance with an exemplary embodiment.

With additional reference to FIG. 3, which is a perspective view of the first electrical connector 102, the first electrical connector 102 includes a housing 120 having a cavity 122 that receives a cable card assembly 130. The housing 120 has a cable end 124 and a mating end 126 opposite the cable end 124. The cables 104 extend from the cable end 124. The mating end 126 is configured to be coupled to the second electrical connector 106. In the illustrated embodiment, the first electrical connector 102 is a right angle connector. For example, the cable end 124 is at the rear of the housing 120 and the mating end 126 is at the bottom of the housing 120. Other locations are possible in alternative embodiments, such as having the mating end 126 at the front or having the cable end 124 at the top. The cable card assembly 130 includes a circuit card 132. The cables 104 are configured to be terminated to the circuit card 132. The circuit card 132 is configured to be plugged into the opening 114 of the second electrical connector 106 when the first electrical connector 102 is mated with the second electrical connector 106. In the illustrated embodiment, the circuit card 132 is provided at the bottom of the first electrical connector 102 and the bottom of the circuit card 132 is mated with the contacts 112 of the second electrical connector 106. For example, the entire circuit card 132 is received in the opening 114 and mated with the contacts 112. However, in alternative embodiments, only a portion of the circuit card 132 may be plugged into the receptacle housing 110. For example, the circuit card 132 may include a card edge that is plugged into a card slot at a front of the receptacle housing 110.

Figure 4:
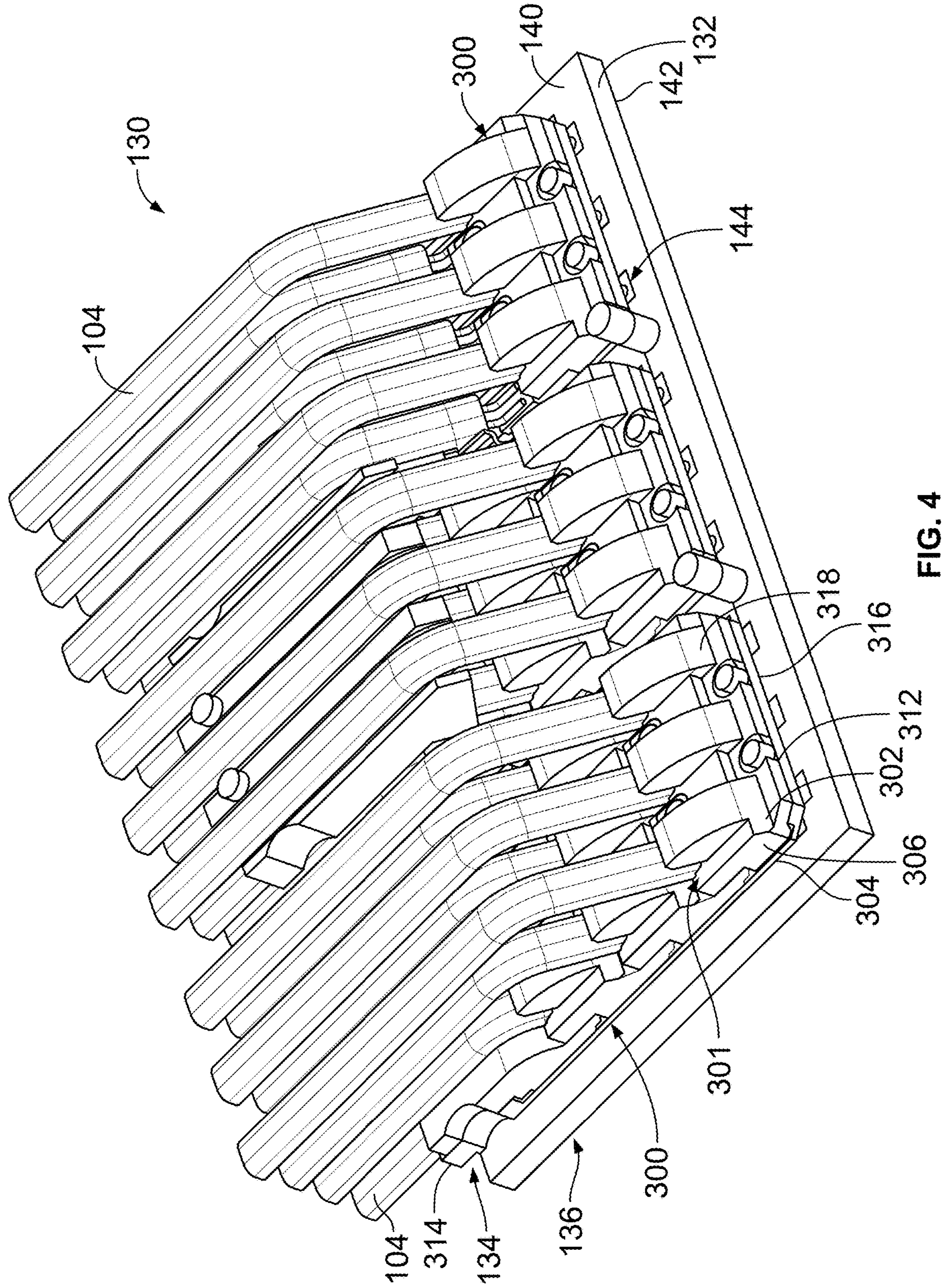
FIG. 4 is a perspective view of the cable card assembly in accordance with an exemplary embodiment.

FIG. 4 is a perspective view of the cable card assembly 130 in accordance with an exemplary embodiment. The cable card assembly 130 includes the circuit card 132, the cables 104 connected to the circuit card 132, and at least one ground bus 300 separate and discrete from the circuit card 132 and coupled to the circuit card 132. The ground bus 300 provides shielding for the ends of the cables 104 at the interface between the cables 104 and the circuit card 132. Optionally, the signal conductors of the cables 104 may be terminated directly to the circuit card 132. Alternatively, a contact assembly (for example, stamped and formed contacts and/or overmolded leadframe(s)) may be provided to electrically connect the signal conductors of the cables 104 to the circuit card 132. The ground bus 300 is electrically coupled to the cables 104, such as cables shields and/or drain wires of the cables 104. The ground bus 300 is electrically coupled to the circuit card 132. For example, the ground bus 300 is electrically connected to circuits or conductors of the circuit card 132, such as to a ground plane and/or ground pads of the circuit card 132.

The ground bus 300 provides electrical shielding for the signal conductors of the cables 104 and the circuit conductors of the circuit card 132. The ground bus 300 is electrically connected to the shield structures of the cables 104, such as to cable shields of the cables 104 and/or drain wires of the cables 104. In an exemplary embodiment, the ground bus 300 is connected to the cable shields and/or the drain wires using a conductive gasket, conductive adhesive, conductive epoxy, a conductive tape or braid, conductive foam, soldering, and the like. In an exemplary embodiment, the ground bus 300 is soldered to the circuit card 132. For example, solder posts or solder tabs are provided at the bottom of the ground bus 300 for soldering to the circuit card 132 at termination areas. In various embodiments, multiple ground busses 300 may be provided.

In an exemplary embodiment, the cable card assembly 130 includes multiple rows and multiple columns of cables 104. The cables 104 may be grouped together, such as in 3×4 arrangements. In the illustrated embodiment, the cables 104 are terminated to one side of the circuit card 132, such as the top side of the circuit card 132. However, the cables 104 may additionally or alternatively be terminated to the bottom side of the circuit card 132. Each row of cables 104 includes the corresponding ground bus 300. The ground busses 300 may be similar for each of the rows. However, the ground busses 300 may be sized and shaped differently to accommodate a stacking/overlapping situation.

The circuit card 132 extends between a cable end 134 (for example, top portion) and a mating end 136 (for example, bottom portion). Other arrangements are possible in alternative embodiments, such as having the mating end 136 at a front edge of the circuit card 132 to plug into a card slot. The cable end 134 may additionally or alternatively be provided at the bottom portion in other alternative embodiments. The cables 104 are configured to be coupled to the circuit card 132 at the cable end 134. The cables 104 extend rearward from the circuit card 132 in the illustrated embodiment. The circuit card 132 includes an upper surface 140 and a lower surface 142. The cables 104 are connected to the circuit card 132 at the upper surface 140 in the illustrated embodiment. The lower surface 142 is configured to be mated to the second electrical connector 106 in the illustrated embodiment.

The circuit card 132 includes circuit conductors 144 (shown in FIG. 8), such as mating pads, traces, vias, and the like. The circuit conductors 144 may be provided at both the upper surface 140 and the lower surface 142. The circuit conductors 144 may include both signal conductors and ground conductors of the circuit card 132. In an exemplary embodiment, the circuit conductors 144 are provided at the cable end 134 for connection to the cables 104 (and/or the contact assembly) and at the mating end 136 for connection to the second electrical connector 106. The circuit conductors 144 at the mating end 136 define mating conductors configured to be electrically connected to corresponding contacts 112 (shown in FIG. 2) of the second electrical connector 106. The circuit conductors 144 at the cable end 134 are configured to be electrically connected to the signal conductors of the cables 104 and the ground bus 300.

The ground bus 300 surrounds the ends of the cables 104. For example, the ends of the cables 104 are located in corresponding pockets 301 in the ground bus 300. The ground bus 300 is three-dimensional. The ground bus 300 is configured to surround all sides of the ends of the cables 104 (for example, the cable top, the cable bottom, the cable right side and the cable left side). The ground bus 300 is electrically connected to the cables 104 (for example, the cable shield and/or drain wires). In an exemplary embodiment, the ground bus 300 is configured to engage and electrically connect to the cable shield of the cable on all sides (for example, the top, the bottom, the right side and the left side). The ground bus 300 is terminated to the circuit card 132. The ground bus 300 electrically commons the cables 104 with the circuit card 132. The ground bus 300 electrically commons the cables 104 with each other. The ground bus 300 provides electrical shielding for signals transmitted between the circuit card 132 and the cables 104. The ground bus 300 enhances electrical performance of the cable card assembly 130, such as by reducing cross talk.

The ground bus 300 includes a shell 302 manufactured from a conductive material, such as a metal material to provide electrical shielding. In various embodiments, the ground bus 300 may be a diecast component. In other various embodiments, the ground bus 300 may be a plated plastic or conductive polymer structure. In other various embodiments, the ground bus 300 may be a stamped and formed component. In an exemplary embodiment, the ground bus 300 is a multipiece structure. For example, the ground bus 300 includes one or more inner bus members 304 and one or more outer bus members 306 coupled to the inner bus member(s) 304. Optionally, one or more conductive gaskets may be provided at the interface(s) between the inner bus member(s) 304 and the outer bus member(s) 306. The inner bus member 304 is located between the outer bus members 306 and the circuit card 132. The ground bus 300 may be oriented such that the inner bus member 304 is a bottom bus member and the outer bus member 306 is a top bus member. However, other orientations are possible in alternative embodiments. The cables 104 are received between the inner bus member 304 and the outer bus member 306. For example, the pockets 301 may be formed by the inner and outer bus members 304, 306 and the cables 104 are received in the pockets 301 between the inner and outer bus members 304, 306.

The ground bus 300 extends between a front 312 and a rear 314. The rear 314 is configured to face the cables 104. The ground bus 300 extends between an inner end 316 and an outer end 318. The inner bus member 304 is at the inner end 316 and the outer bus member 306 is at the outer end 318. The cables 104 may extend from the outer end 318, such as toward the rear 314. The ground bus 300 may be oriented such that the inner end 316 is a bottom end and the outer end 318 is a top end. However, other orientations are possible in alternative embodiments. In various embodiments, the inner end 316 is at the bottom and is configured to face the circuit card 132. The inner end 316 may be mounted to the circuit card 132 to mechanically and electrically connect the ground bus 300 to the circuit card 132. In an exemplary embodiment, the inner end 316 is configured to be soldered to the circuit card 132.

Figure 5:
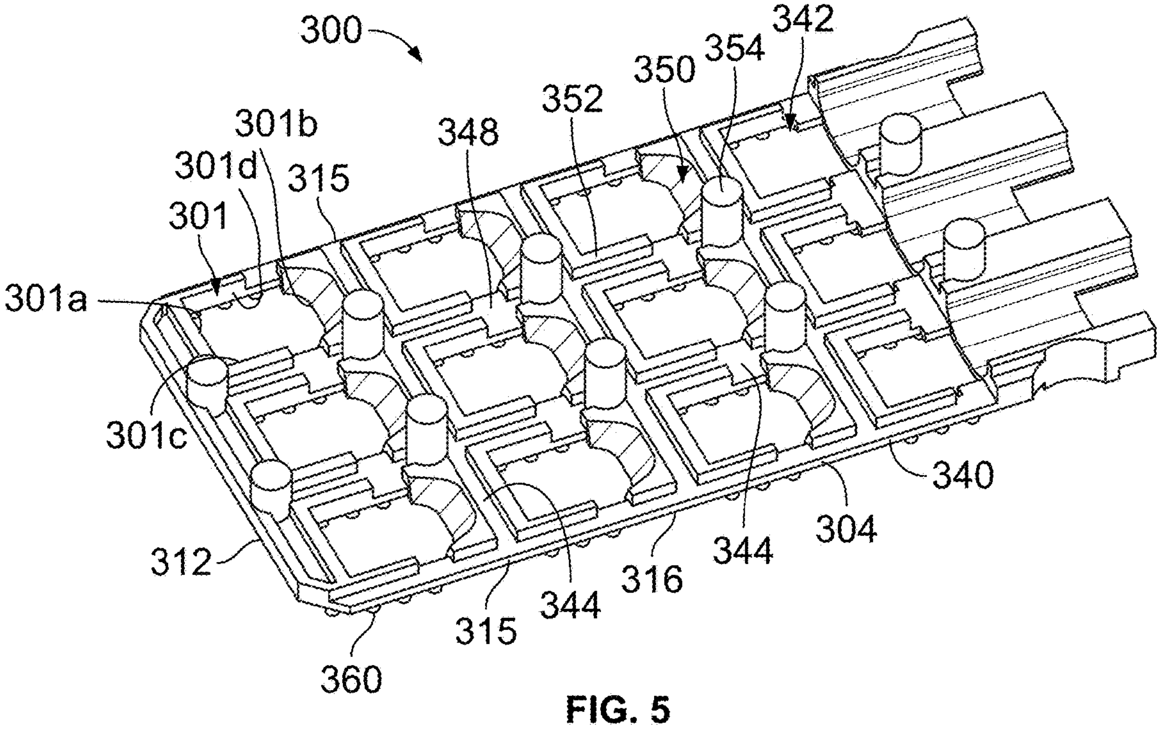
FIG. 5 is a top perspective view of a portion of the ground bus showing the inner bus member in accordance with an exemplary embodiment.
Figure 6:
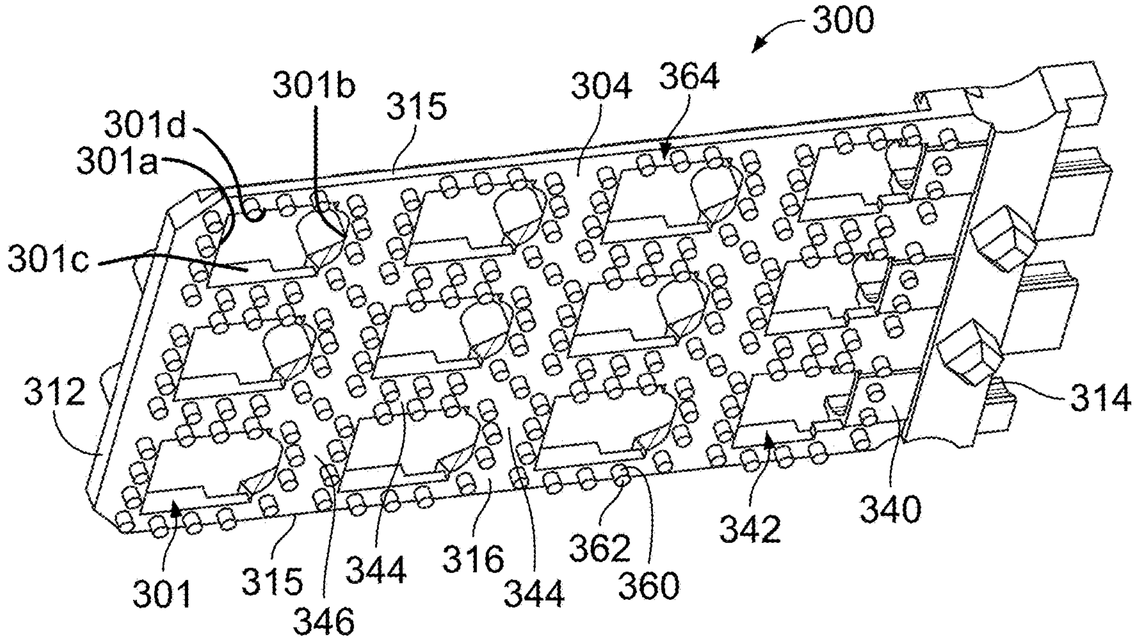
FIG. 6 is a bottom perspective view of a portion of the ground bus showing the inner bus member in accordance with an exemplary embodiment.

FIG. 5 is a top perspective view of a portion of the ground bus 300 showing the inner bus member 304 in accordance with an exemplary embodiment. FIG. 6 is a bottom perspective view of a portion of the ground bus 300 showing the inner bus member 304 in accordance with an exemplary embodiment.

The inner bus member 304 is manufactured from a conductive material, such as a metal material. In various embodiments, the inner bus member 304 is a diecast member. In other various embodiments, the inner bus member 304 may be a plated plastic member. In the illustrated embodiment, the inner bus member 304 is shown as a single unit between the front 312 and the rear 314 configured to accommodate multiple rows of the cables 104. However, in alternative embodiments, the inner bus member 304 may be a multi-piece structure, such as including a stack of bus elements arranged front to rear to accommodate corresponding rows of the cables 104.

The inner bus member 304 includes a base 340 extending between the front 312 and the rear 314. The base 340 includes sides 315 that extend between the front 312 and the rear 314. In an exemplary embodiment, the base 340 includes a plurality of openings 342 therethrough. The openings 342 form portions of the pockets 301. The base 340 includes separating walls 344 between the openings 342/pockets 301. The separating walls 344 surround the pockets 301. For example, the separating walls 344 extend along both sides of the pockets 301, extend along the fronts of the pockets 301 and extend along the rears of the pockets 301. The separating walls 344 provide shielding between the pockets 301. The separating walls 344 of the inner bus member 304 extend between a bottom or a lower surface 346 and a top or an upper surface 348. The bottom 346 is configured to face the circuit card 132. The outer bus members 306 (FIG. 7) are configured to be coupled to the inner bus member 304 at the upper surface 348. The conductive gaskets may be provided at the upper surface 348.

In an exemplary embodiment, the base 340 includes cable cradles 350 configured to receive corresponding cables 104. The cable cradles 350 form portions of the pockets 301. The cable cradles 350 support the cables 104 for termination to the circuit card 132. The cable cradles 350 define a cable exit and control the cable exit direction for the cables 104. For example, the cable exit direction may be upward and rearward from the base 340, such as to elevate the cables 104 over the rearward rows of cables. In various embodiments, the cable exit direction may be approximately 45°. The cable cradles 350 provide support for the cables 104, such as to provide strain relief for the cables 104. The cable cradles 350 may form an area for electrical connection to the cable shield of the cable 104, such as along the bottom and sides of the cable shield.

In an exemplary embodiment, the inner bus member 304 includes shielding elements 352 extending along the upper surfaces 348 of the separating walls 344. The shielding elements 352 are used for positioning and/or shielding between the outer bus members 306. The shielding elements 352 are located between the pockets 301. The shielding elements 352 may be protrusions, such as lips or walls extending from the separating walls 344. In alternative embodiments, the shielding elements 352 may be grooves or slots formed in the separating walls 344. Other types of shielding elements may be used in alternative embodiments. The shielding elements 352 are sized and shaped to interact with complimentary elements of the outer bus members 306.

In an exemplary embodiment, the inner bus member 304 includes locating pins 354 extending from the separating walls 344. The locating pins 354 may extend upward from the upper surfaces 346 of the separating walls 344. The locating pins 354 are configured to interface with the outer bus members 306 to locate the outer bus members 306 relative to the inner bus member 304. For example, the locating pins 354 may be received in openings in the outer bus members 306 to align the outer bus members 306 with the inner bus member 304. The locating pins 354 may be press-fit into the outer bus members 306 to mechanically and electrically connect the outer bus member 306 to the inner bus member 304.

In an exemplary embodiment, the inner bus member 304 includes solder standoff posts 360 extending from the inner end 316. For example, the solder standoff posts 360 extend from the lower surface 364 to terminating ends 362 at distal ends of the solder standoff posts 360. The solder standoff posts 360 are configured to be terminated to the circuit card 132. In an exemplary embodiment, the solder standoff posts 360 are soldered to the circuit card 132. Solder balls may be provided at the terminating ends 362. In an exemplary embodiment, the solder standoff posts 360 are configured to hold the inner end 316 elevated from the surface of the circuit card. The solder standoff posts 360 may hold the inner end 316 off the circuit card 132 to ensure solder fillets up the solder standoff posts 360 and does not wick away from one post to another post to ensure good electrical connections at each of the solder standoff posts 360.

In an exemplary embodiment, the solder standoff posts 360 surround each pocket 301. For example, the solder standoff posts 360 extend from the inner end 316 along each of the pocket front 301*a*, the pocket rear 301*b*, the first pocket side 301*c*, and the second pocket side 301*d* of each pocket 301. The solder standoff posts 360 extend from each of the separating walls 344. In an exemplary embodiment, each separating wall 344 includes a plurality of the solder standoff posts 360. For example, a plurality of the solder standoff posts 360 are provided forward of each opening 342; a plurality of the solder standoff posts 360 are provided rearward of each opening 342; a plurality of the solder standoff posts 360 are provided along the right side of each opening 342; and a plurality of the solder standoff posts 360 are provided along the left side of each opening 342. The solder standoff posts 360 form a picket fence type of shielding structure surrounding each pocket 301.

In an exemplary embodiment, the solder standoff posts 360 are cylindrical. However, the solder standoff posts 360 may have other shapes. In an exemplary embodiment, each solder standoff posts 360 has a post width (for example, a diameter). The solder standoff posts 360 are separated by gaps 364. In an exemplary embodiment, the solder standoff posts 360 are closely spaced. For example, the gaps 364 have gap widths less than three times the post width. Optionally, the gap widths may be approximately equal to the post widths. The gap widths may be sufficiently small to reduce or minimize cross talk and return loss for efficient operation at a target frequency. In various embodiments, the solder standoff posts 360 may be spaced apart at distances to prevent crosstalk at a target frequency, such as approximately 67 GHz. In various embodiments, the gap widths may be approximately 0.5 mm. The gap widths may be approximately 1.0 mm. The gap widths may be narrower or wider in alternative embodiments for other target frequencies.

Figure 7:
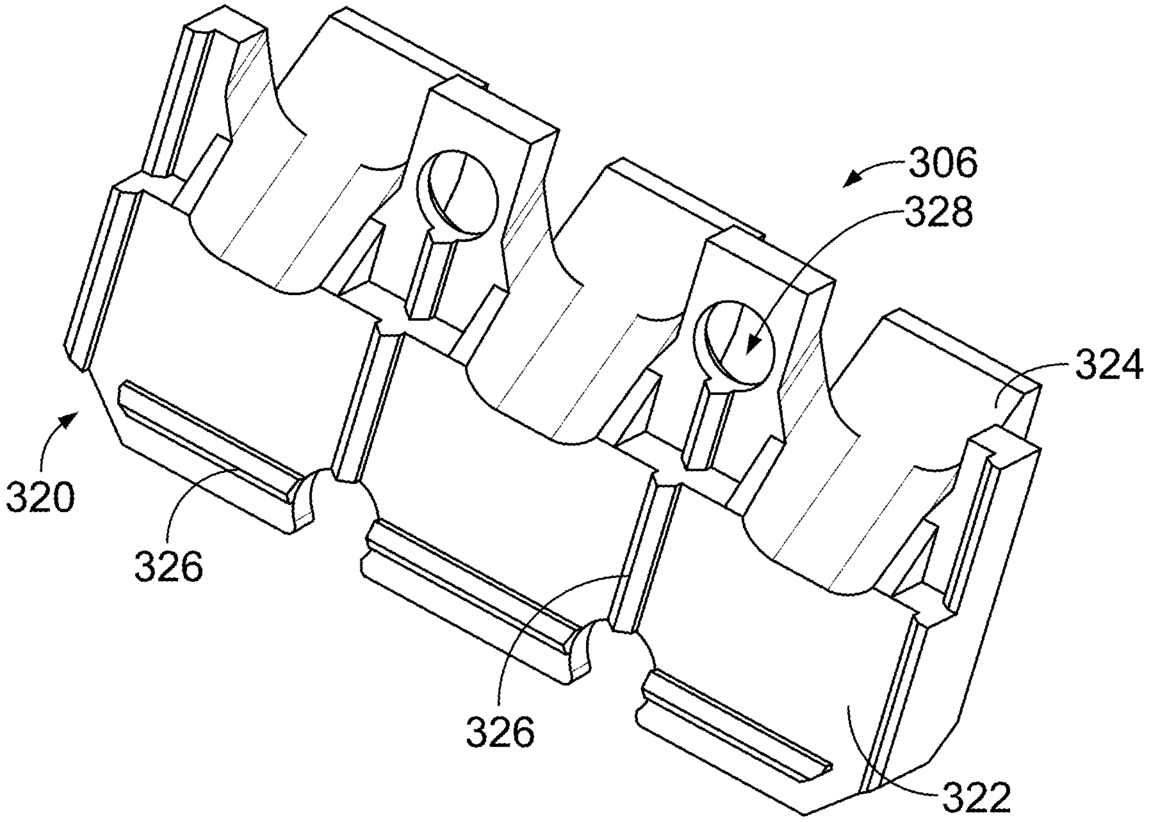
FIG. 7 is a bottom perspective view of a portion of the ground bus showing the outer bus member in accordance with an exemplary embodiment.

FIG. 7 is a bottom perspective view of a portion of the ground bus 300 showing the outer bus member 306 in accordance with an exemplary embodiment. The outer bus member 306 extends between a front and a rear. The outer bus member 306 is manufactured from a conductive material, such as a metal material. In various embodiments, the outer bus member 306 is a diecast member. In other various embodiments, the outer bus member 306 may be stamped and formed or a plated plastic member. The outer bus member 306 is configured to provide shielding for the cables 104.

The outer bus member 306 includes a cap 320 having a base wall 322 and cable covers or hoods 324. The cable covers 324 cover the ends of the cables 104. The cable covers 324 may be angled to accommodate the cables 104 extending outward from the circuit card 132, such as at an angle between 30° and 60°. The base wall 322 is provided at the bottom or inner end of the outer bus member 306. The base wall 322 is configured to be coupled to the inner bus member 304 (shown in FIG. 5).

In an exemplary embodiment, the outer bus member 306 includes shielding elements 326 extending from the base wall 322 of the cap 320. The shielding elements 326 are used for positioning and/or shielding between the outer bus member 306 and the inner bus member 304. The shielding elements 326 may interact with the shielding elements 352 of the inner bus member 304 to locate the outer bus member 306 relative to the inner bus member 304. The shielding elements 352 cause the base wall 322 to be non-planar, which provides surfaces for making connections to improve EMI shielding at the interface. In an exemplary embodiment, the cap 320 includes openings 328 in the base wall 322. The openings 328 receive the locating pins 354 (FIG. 5) to locate the outer bus member 306 relative to the inner bus member 304.

Figure 8:
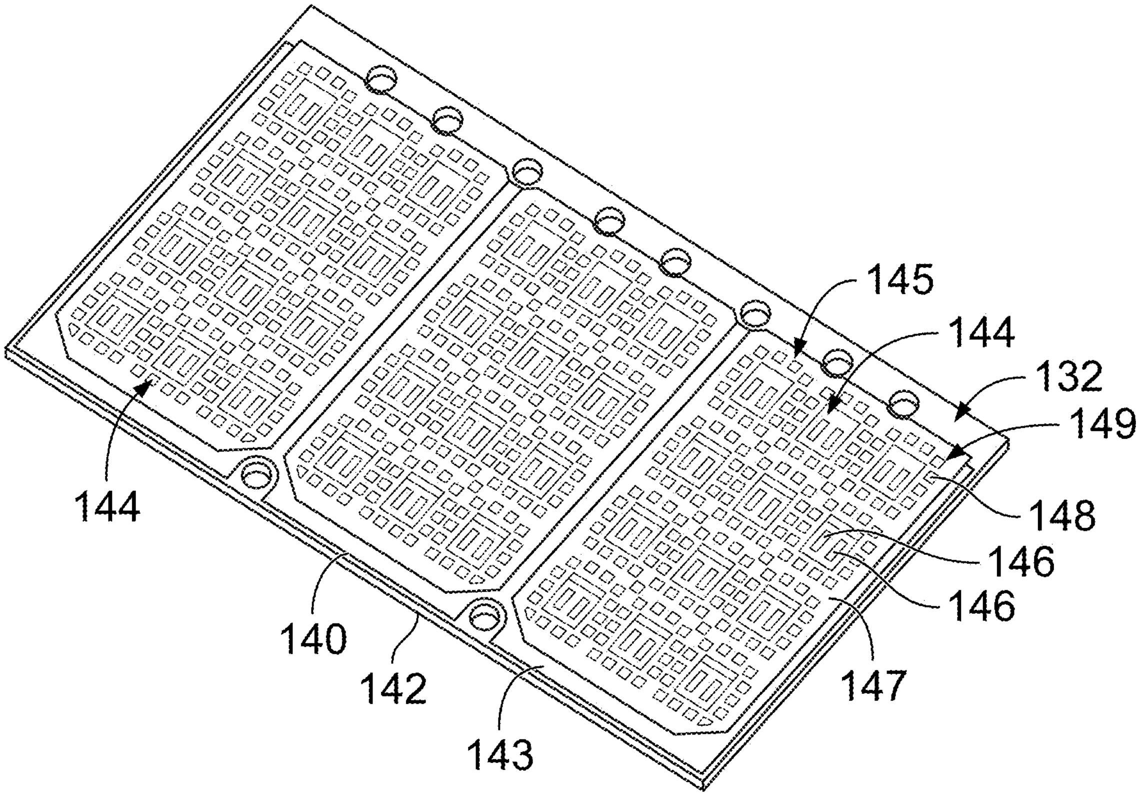
FIG. 8 is a top perspective view of the circuit card in accordance with an exemplary embodiment.

FIG. 8 is a top perspective view of the circuit card 132 in accordance with an exemplary embodiment. The circuit card 132 is a printed circuit board in an exemplary embodiment. The circuit card 132 includes circuits on one or more layers of the circuit card, such as pads, traces, vias, and the like. The circuit card 132 extends between the upper surface 140 and the lower surface 142.

In an exemplary embodiment, the circuit card 132 includes cable termination areas 145 at the upper surface 140. The cable termination areas 145 are configured to receive the corresponding cables 104. In an exemplary embodiment, the cable termination areas 145 are arranged in rows and columns. The circuit conductors 144 are arranged in the cable termination areas 145. For example, the circuit conductors 144 includes signal pads 146 and ground pads 148 in the cable termination areas 145. The signal pads 146 and the ground pads 148 are provided at the upper surface 140. The ground pads 148 are connected to the one or more ground planes 143 of the circuit card 132. The ground pads 148 are configured to be electrically connected to the corresponding solder standoff posts 360. For example, the solder standoff posts 360 may be soldered to the corresponding ground pads 148.

In an exemplary embodiment, the signal pads 146 are arranged in pairs. For example, each cable termination area 145 includes one pair of the signal pads 146. A solder mask 147 surrounds the signal pads 146 and/or the ground pads 148 to separate the circuit conductors 144 from each other. The individual ground pads 148 are isolated from each other and separated by barriers defined by the solder mask 147. In an exemplary embodiment, the ground pads 148 surround the pair of the signal pads 146. For example, the ground pads 148 form shield fences 149 around each pair of the signal pads 146. Each cable termination area 145 includes a corresponding shield fence 149. In an exemplary embodiment, the ground pads 148 completely surround the signal pads 146. For example, the ground pads 148 are located forward of the pair, rearward of the pair, along the right side of the pair, and along the left side of the pair. In an exemplary embodiment, multiple ground pads 148 are arranged along the front of the pair; multiple ground pads 148 are arranged along the rear of the pair; multiple ground pads 148 are arranged along the right side of the pair; and multiple ground pads 148 are arranged along the left side of the pair.

Figure 9:
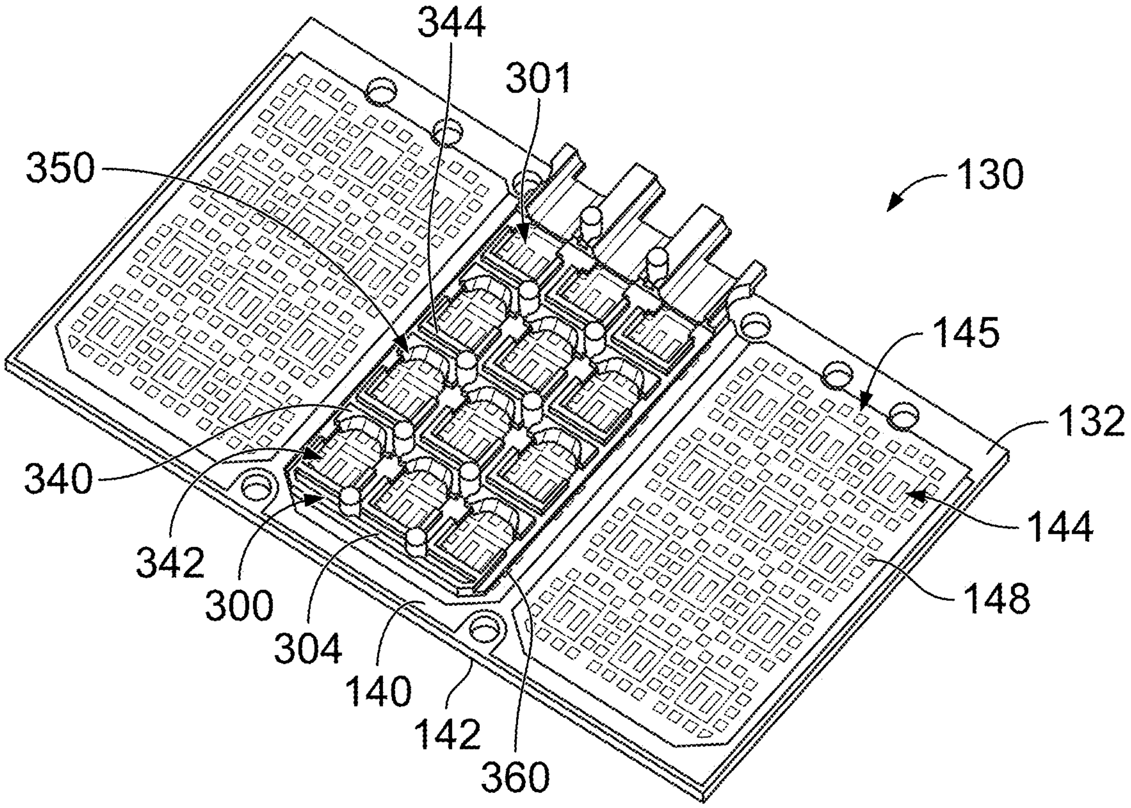
FIG. 9 is a top perspective view of a portion of the cable card assembly showing the inner bus member of the ground bus mounted to the circuit card in accordance with an exemplary embodiment.
Figure 10:
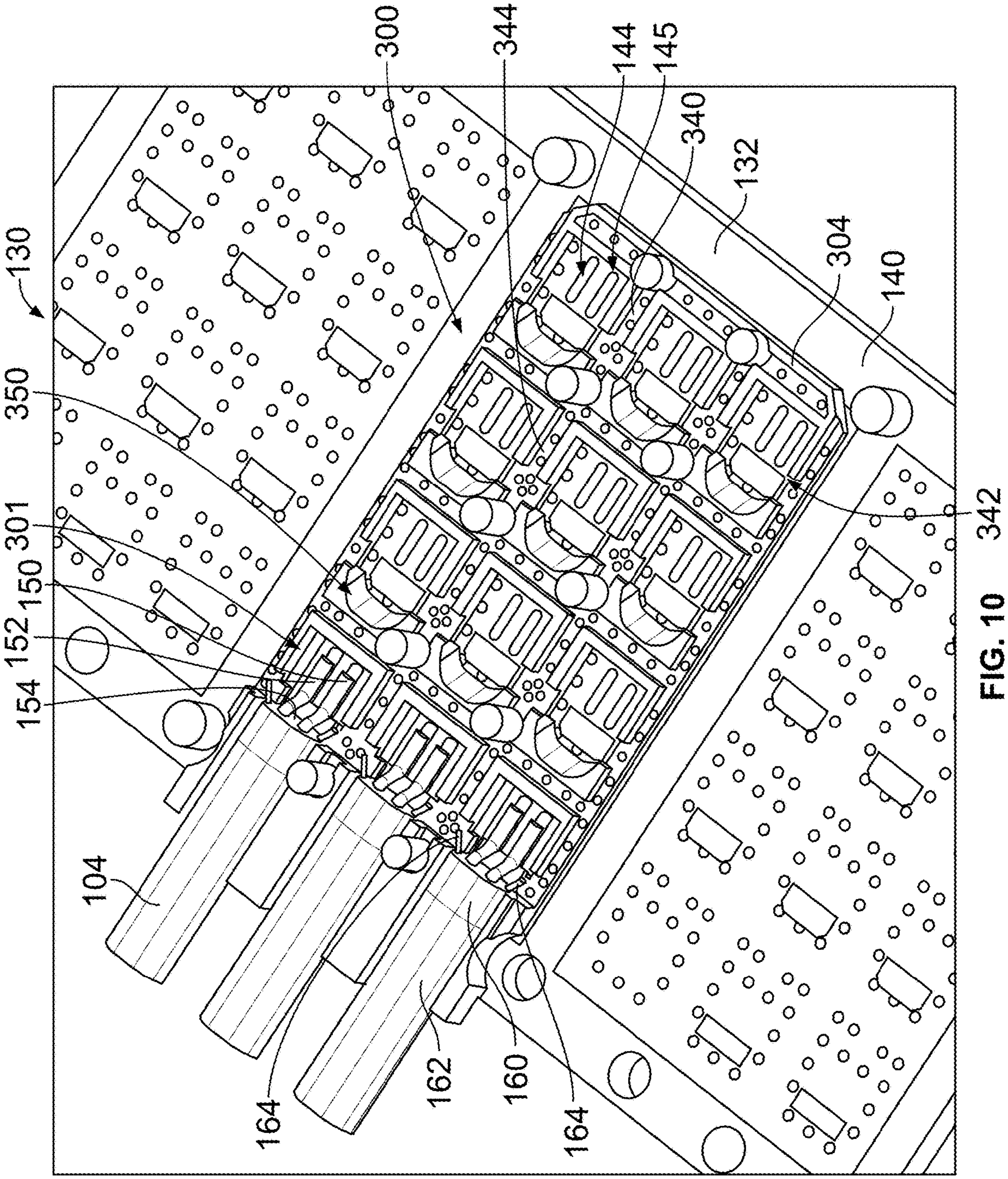
FIG. 10 is a top perspective view of a portion of the cable card assembly in accordance with an exemplary embodiment showing a portion of the ground bus and a subset of the cables.
Figure 11:
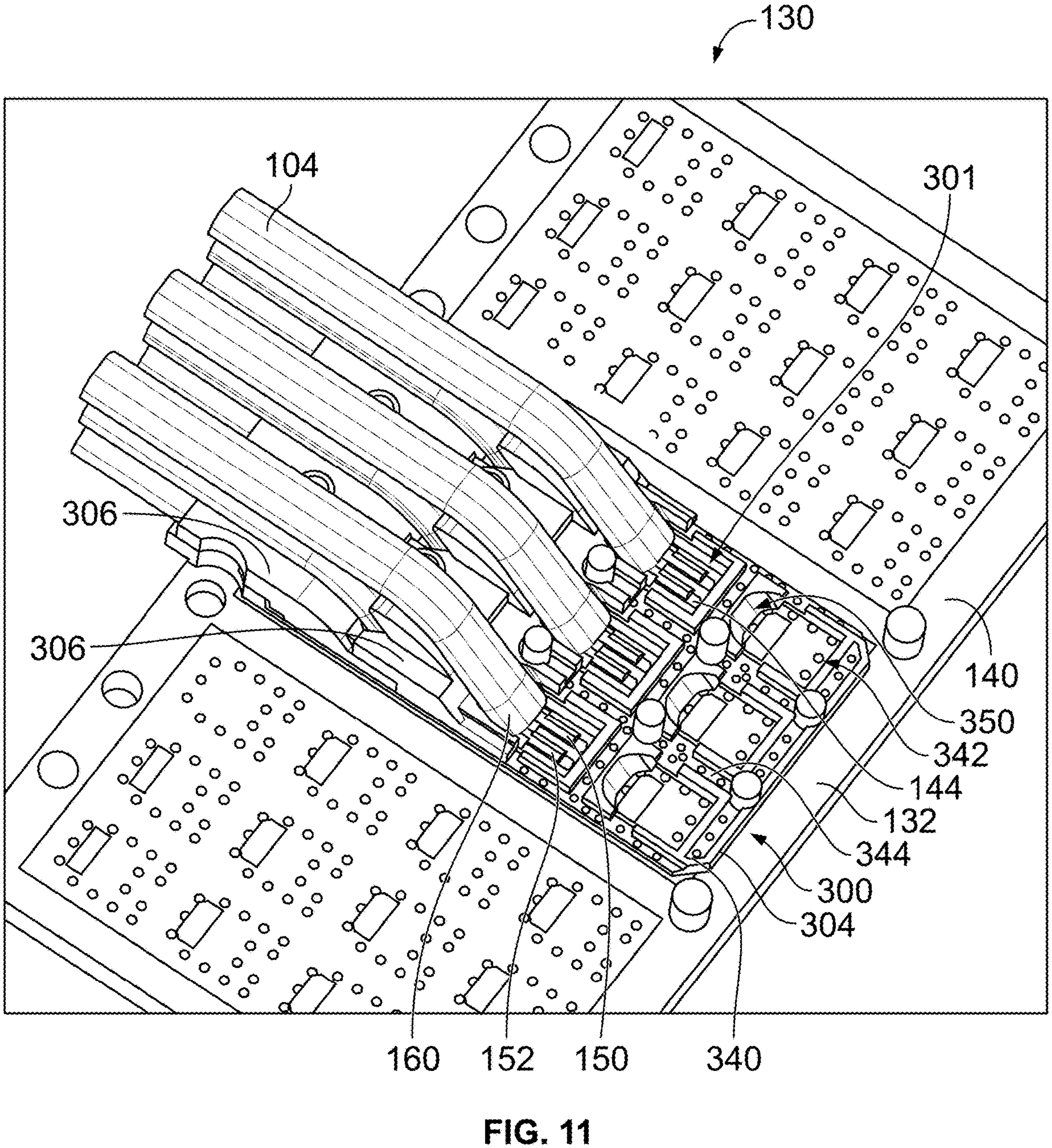
FIG. 11 is a top perspective view of a portion of the cable card assembly in accordance with an exemplary embodiment showing a portion of the ground bus and subsets of the cables.
Figure 12:
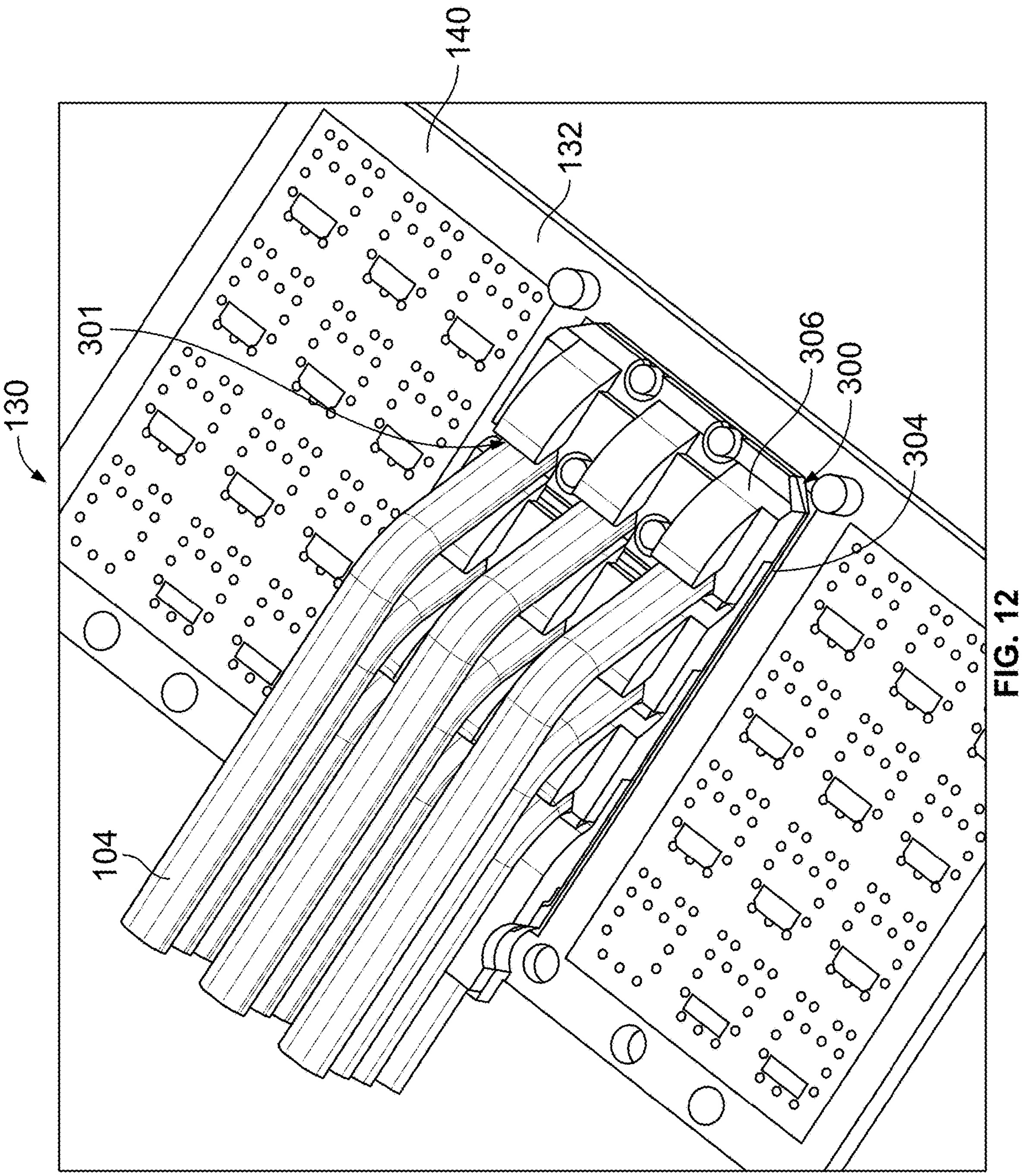
FIG. 12 is a top perspective view of a portion of the cable card assembly in accordance with an exemplary embodiment showing outer bus members coupled to the inner bus member and covering the cables.

FIG. 9 is a top perspective view of a portion of the cable card assembly 130 showing the inner bus member 304 of the ground bus mounted to the circuit card 132. FIG. 10 is a top perspective view of a portion of the cable card assembly 130 in accordance with an exemplary embodiment showing a portion of the ground bus 300 and a subset of the cables 104. FIG. 11 is a top perspective view of a portion of the cable card assembly 130 in accordance with an exemplary embodiment showing a portion of the ground bus 300 and subsets of the cables 104. FIG. 12 is a top perspective view of a portion of the cable card assembly 130 in accordance with an exemplary embodiment showing outer bus members 306 coupled to the inner bus member 304 and covering the cables 104.

Each cable 104 includes at least one signal conductor and a shield structure providing electrical shielding for the at least one signal conductor. In an exemplary embodiment, the cables 104 are twin-axial cables. For example, each cable 104 includes a first signal conductor 150 and a second signal conductor 152. The signal conductors 150, 152 carry differential signals. The signal conductors 150, 152 are configured to be electrically connected to corresponding circuit conductors 144 of the circuit card 132. However, the cables 104 may include greater or fewer signal conductors in alternative embodiments, such as being a coaxial cable.

The cable 104 includes one or more insulators 154 surrounding the signal conductors 150, 152 and a cable shield 160 surrounding the insulators 154. The cable shield 160 provides circumferential shielding around the signal conductors 150, 152. The cable 104 includes a cable jacket 162 surrounding the cable shield 160. In various embodiments, the cable 104 includes one or more drain wires 164 electrically connected to the cable shield 160. In alternative embodiments, the cable 104 is provided without a drain wire.

In an exemplary embodiment, the cable jacket 162, the cable shield 160, and the insulators 154 may be removed (e.g., stripped) to expose portions of the signal conductors 150, 152 for termination to the circuit card 132 (or to the contact assembly). A portion of the cable shield 160 may be exposed and/or portions of the drain wires 164 may be exposed for termination to the ground bus 300. The exposed portions of the signal conductors 150, 152 are configured to be mechanically and electrically coupled (e.g., soldered) to corresponding circuit conductors 144 of the circuit card 132. The cable shield 160 does not extend along the exposed portions. However, the ground bus 300 extends along the exposed portions and provides shielding for the exposed portions. For example, the ground bus 300 may extend along the top, the bottom, and both sides of the cable 104. In an exemplary embodiment, the ground bus 300 physically engages, to electrically connect to, the cable shield 160 at multiple points of contact, such as along the top, the bottom and both sides of the cable shield 160. The ground bus 300 may be shaped and positioned relative to the exposed portions to control impedance along the signal paths. For example, the ground bus 300 may be shaped and positioned relative to the exposed portions to maintain a target impedance along the signal paths (for example, 50 Ohms, 75 Ohms, 100 Ohms, and the like).

During assembly, the inner bus member 304 is mounted to the circuit card 132. The pockets 301 of the ground bus 300 are aligned with the cable termination areas 145. The solder standoff posts 360 are mounted to the ground pads 148 of the circuit card 132. In an exemplary embodiment, each solder standoff post 360 is soldered to the corresponding ground pad 148, such as by a reflow soldering process. The solder standoff posts 360 hold the base 340 with the lower surface 142 elevated off of the upper surface 140 of the circuit card 132, which provides an air space around the cable termination areas 145. Each solder standoff post 360 is directly electrically connected to the circuit card 132, such as being soldered to the corresponding ground pad 148 to ensure a good electrical connection is made between the ground bus 300 and the ground plane of the circuit card 132 at all of the desired locations (for example, at a predetermined spacing).

The inner bus member 304 includes multiple rows of the openings 342, corresponding to the pockets 301, to receive the multiple rows of the cables 104. In an exemplary embodiment, a single inner bus member 304 is provided, which accommodates multiple rows and columns of the cables 104. The single inner bus member 304 is configured to be coupled to the circuit card 132 in a single assembly process (for example, a single reflow solder process), rather than coupling many individual cable shields around each individual cable 104.

During assembly, rows of the cables 104 are coupled to the circuit card 132, followed by coupling the corresponding outer bus member 306 to the inner bus member 304. As such, rows of the cables and outer bus members 306 may be stacked to form the cable card assembly 130. The outer bus members 306 may be connected to the inner bus member 304 by a press fit (interference fit), by soldering, using conductive adhesive, using conductive epoxy, using fasteners, or by other means. The outer bus members 306 shield or cover the tops of the cables 104. Each cable 104

The ground bus 300 is configured to provide shielding for the cables 104. For example, the inner bus member 304 and the outer bus members 306 cooperate to form the pockets 301 that receive the corresponding cables 104. Optionally, each pocket 301 may receive a single (for example, different) cable 104. The ground bus 300 includes multiple rows of the pockets 301 to receive the multiple rows of the cables 104. The cables 104 are received in the cable cradles 350 and the ends of the cables 104 are received in the openings 342 for termination to the circuit card 132. The separating walls 344 provide shielding between the pockets 301 and the cables 104 in the different pockets 301.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A cable card assembly for an electrical connector comprising:

a circuit card having an array of signal pads on a surface of the circuit card, the circuit card having a ground plane;

cables terminated to the circuit card, the cables including signal conductors and cable shields surrounding the corresponding signal conductors to provide electrical shielding for the signal conductors, the signal conductors being electrically connected to corresponding signal pads of the circuit card; and a ground bus coupled to the circuit card, the ground bus being electrically connected to the cable shields of the cables, the ground bus being electrically connected to the ground plane of the circuit card, the ground bus including a shell forming pockets receiving the corresponding cables, the shell being mounted to the circuit card, the shell including solder standoff posts extending from an inner end of the shell, the solder standoff posts holding the inner end elevated from the surface of the circuit card, the solder standoff posts being terminated to the circuit card.

2. The cable card assembly of claim 1, wherein the solder standoff posts surround each pocket.

3. The cable card assembly of claim 1, wherein the shell includes separating walls between the pockets, the solder standoff posts extending from each of the separating walls.

4. The cable card assembly of claim 1, wherein each pocket includes a pocket front, a pocket rear, a first pocket side, and a second pocket side, the solder standoff posts extending from the inner end along each of the pocket front, the pocket rear, the first pocket side, and the second pocket side of each pocket.

5. The cable card assembly of claim 1, wherein the shell includes a plurality of the solder standoff posts between each pocket.

6. The cable card assembly of claim 1, wherein the circuit card includes ground pads at the surface, the solder standoff posts being terminated to corresponding ground pads.

7. The cable card assembly of claim 6, wherein the circuit card includes cable terminating areas, each cable terminated to the circuit card at a different cable terminating area, the ground pads forming shield fences surrounding each cable terminating area.

8. The cable card assembly of claim 6, wherein the ground pads are physically separated from each other, the ground pads being electrically connected to the ground plane.

9. The cable card assembly of claim 1, wherein the shell includes cable cradles exiting from the pockets, the cables being received in the corresponding cable cradles and exiting the pockets along the cable cradles at cable exit directions, the cable exit directions been at transverse angles to the surface of the circuit card.

10. The cable card assembly of claim 1, wherein the ground bus extends between a front and a rear of the ground bus, the ground bus including multiple rows of the pockets between the front and the rear of the ground bus.

11. The cable card assembly of claim 1, wherein the shell includes an inner bus member and an outer bus member coupled to the inner bus member, the inner bus member including openings forming portions of the pockets, the solder standoff posts extending from the inner bus member and surrounding the openings, the outer bus member including hoods aligned with the corresponding openings and forming portions of the pockets, the hoods covering the ends of the cables.

12. The cable card assembly of claim 11, wherein the outer bus member is one of a plurality of outer bus members coupled to the inner bus member, each outer bus member covering a different role of the cables.

13. The cable card assembly of claim 1, wherein the shell is coupled to the cable shield of each cable at a bottom of the cable, a top of the cable, a first side of the cable, and a second side of the cable to form at least four points of contact with the cable shield.

14. The cable card assembly of claim 1, wherein each solder standoff post includes a terminating end, the terminating end being soldered to a corresponding ground pad at the surface of the circuit card.

15. The cable card assembly of claim 1, wherein each solder standoff post has a post width, the solder standoff posts being separated by gaps, the gaps having gap widths less than three times the post width.

16. A cable card assembly for an electrical connector comprising:

a circuit card having an array of signal pads on a surface of the circuit card, the signal pads being arranged in pairs, the array of signal pads being arranged in multiple rows, the circuit card having a ground plane;

cables having ends terminated to the circuit card, the cables being arranged in rows, each cable including a pair of signal conductors and a cable shield surrounding the corresponding signal conductors to provide electrical shielding for the signal conductors, the signal conductors being electrically connected to corresponding signal pads of the circuit card; and a ground bus coupled to the circuit card, the ground bus extending between a front and a rear of the ground bus, the ground bus being electrically connected to the cable shields of the cables, the ground bus being electrically connected to the ground plane of the circuit card, the ground bus including a shell forming pockets receiving the corresponding cables, the pockets being arranged in a plurality of rows between the front and the rear of the ground bus, the shell having an inner end mounted to the circuit card, the shell covering the ends of the cables.

17. The cable card assembly of claim 16, wherein the solder standoff posts surround each pocket.

18. The cable card assembly of claim 16, wherein the circuit card includes cable terminating areas, each cable terminated to the circuit card at a different cable terminating area, the circuit card including ground pads at the surface forming shield fences surrounding each contact terminating area, the solder standoff posts being terminated to corresponding ground pads.

19. The cable card assembly of claim 16, wherein the shell is coupled to the cable shield of each cable at a bottom of the cable, a top of the cable, a first side of the cable, and a second side of the cable to form at least four points of contact with the cable shield.

20. A cable card assembly for an electrical connector comprising:

a circuit card having an array of signal pads on a surface of the circuit card, the signal pads being arranged in pairs, the array of signal pads being arranged in multiple rows, the circuit card having a ground plane;

cables having ends terminated to the circuit card, the cables being arranged in rows, each cable including a pair of signal conductors and a cable shield surrounding the corresponding signal conductors to provide electrical shielding for the signal conductors, the signal conductors being electrically connected to corresponding signal pads of the circuit card; and a ground bus coupled to the circuit card, the ground bus extending between a front and a rear of the ground bus, the ground bus being electrically connected to the cable shields of the cables, the ground bus being electrically connected to the ground plane of the circuit card, the ground bus including a shell forming pockets receiving the corresponding cables, the pockets being arranged in a plurality of rows between the front and the rear of the ground bus, the shell being mounted to the circuit card, the shell covering the ends of the cables, the shell including solder standoff posts extending from an inner end of the shell, the solder standoff posts holding the inner end elevated from the surface of the circuit card, the solder standoff posts being terminated to the circuit card.

* * * * *